(12) United States Patent
Sugimoto et al.

(10) Patent No.: US 12,100,760 B2
(45) Date of Patent: Sep. 24, 2024

(54) SEMICONDUCTOR DEVICE AND SEMICONDUCTOR SYSTEM INCLUDING SEMICONDUCTOR DEVICE

(71) Applicant: FLOSFIA INC., Kyoto (JP)

(72) Inventors: Masahiro Sugimoto, Kyoto (JP); Isao Takahashi, Kyoto (JP); Takashi Shinohe, Kyoto (JP)

(73) Assignee: FLOSFIA INC., Kyoto (JP)

( * ) Notice: Subject to any disclaimer, the term of this patent is extended or adjusted under 35 U.S.C. 154(b) by 0 days.

(21) Appl. No.: 16/644,282

(22) PCT Filed: Jul. 11, 2019

(86) PCT No.: PCT/JP2019/027444
§ 371 (c)(1),
(2) Date: Mar. 4, 2020

(87) PCT Pub. No.: WO2020/013262
PCT Pub. Date: Jan. 16, 2020

(65) Prior Publication Data
US 2020/0388684 A1    Dec. 10, 2020

(30) Foreign Application Priority Data
Jul. 12, 2018  (JP) .................. 2018-132765

(51) Int. Cl.
*H01L 29/78* (2006.01)
*H01L 29/04* (2006.01)
(Continued)

(52) U.S. Cl.
CPC .............. *H01L 29/78* (2013.01); *H01L 29/04* (2013.01); *H01L 29/24* (2013.01);
(Continued)

(58) Field of Classification Search
CPC ................ H01L 29/7869; H01L 29/24; H01L 21/02565; H01L 29/78; H01L 29/04; H01L 29/66969
See application file for complete search history.

(56) References Cited

U.S. PATENT DOCUMENTS 5,763,655 A     6/1998  Patois et al.
5,989,785 A    11/1999  Ishihara et al.
(Continued)

FOREIGN PATENT DOCUMENTS

JP    8-227793    9/1996
JP    9-25255     1/1997
(Continued)

OTHER PUBLICATIONS

Enhanced thermal stability of alpha gallium oxide films supported by aluminum doping; Sam-Dong Lee et al.; Japanese Journal of Applied physics; 54; 030301; (2015).*
(Continued)

*Primary Examiner* — Samuel A Gebremariam
*Assistant Examiner* — Jonas T Beardsley
(74) *Attorney, Agent, or Firm* — Wenderoth, Lind & Ponack, L.L.P.

(57) ABSTRACT

A semiconductor device includes an oxide semiconductor film having a corundum structure or containing as a major component gallium oxide or a mixed crystal of gallium oxide, and the semiconductor device is a normally-off semiconductor device with a threshold voltage that is 3V or more.

20 Claims, 5 Drawing Sheets

(51) Int. Cl.
  *H01L 29/24* (2006.01)
  *H01L 29/786* (2006.01)
  *H02M 3/335* (2006.01)

(52) U.S. Cl.
  CPC .... *H01L 29/78642* (2013.01); *H01L 29/7869* (2013.01); *H02M 3/33573* (2021.05); *H02M 3/33576* (2013.01)

(56) References Cited

U.S. PATENT DOCUMENTS

| | | |
|---|---|---|
| 2005/0199967 A1 | 9/2005 | Hoffman |
| 2006/0121700 A1* | 6/2006 | Peng .................. H01L 21/3143 438/149 |
| 2012/0061663 A1* | 3/2012 | Yamazaki ............... H01L 29/04 257/43 |
| 2013/0221359 A1 | 8/2013 | Cho et al. |
| 2014/0139772 A1* | 5/2014 | Kim .................... H01L 29/7869 257/43 |
| 2014/0217469 A1 | 8/2014 | Sasaki et al. |
| 2014/0217470 A1* | 8/2014 | Sasaki ................ H01L 21/0242 257/192 |
| 2015/0108468 A1 | 4/2015 | Cheon et al. |
| 2015/0325659 A1 | 11/2015 | Hitora et al. |
| 2016/0247927 A1* | 8/2016 | Nomura ............ H01L 29/78618 |
| 2017/0110591 A1* | 4/2017 | Bang ................ H01L 29/41733 |
| 2017/0179249 A1 | 6/2017 | Oda et al. |
| 2017/0278933 A1* | 9/2017 | Sasaki ............... H01L 21/02414 |
| 2017/0365629 A1* | 12/2017 | Fujimaki ............... H01L 31/032 |
| 2019/0157400 A1 | 5/2019 | Tanikawa et al. |
| 2019/0189441 A1 | 6/2019 | Fujita et al. |

FOREIGN PATENT DOCUMENTS

| | | |
|---|---|---|
| JP | 11-21687 | 1/1999 |
| JP | 2005-340308 | 12/2005 |
| JP | 2013-058637 | 3/2013 |
| JP | WO2013/035842 | 3/2013 |
| JP | 2015-228495 | 12/2015 |
| JP | 2016-025256 | 2/2016 |
| JP | 2017-224794 | 12/2017 |
| JP | 2018-002544 | 1/2018 |
| JP | WO2018/004008 | 1/2018 |
| JP | WO2018/043503 | 3/2018 |
| WO | 2016/031633 | 3/2016 |

OTHER PUBLICATIONS

International Search Report issued Oct. 15, 2019 in International (PCT) Application No. PCT/JP2019/027444.
Written Opinion of the International Searching Authority issued Oct. 15, 2019 in International (PCT) Application No. PCT/JP2019/027444 with English translation.
Kaneko, Kentaro, "Growth and Physical Properties of Corundum-Structured Gallium Oxide Alloy Thin Films", Dissertation, Kyoto Univ., pp. 1-116, Mar. 2013 with English translation of abstract.
Tatsuya, Takemoto, "Power Semiconductor Gallium Oxide" Thermal Conductivity, P-type . . . Overcoming Issues and Putting it into Practical Use. [online], EE Times, Japan, Retrieved Jun. 21, 2016, from http://eetimes.jp/ee/articles/1402/27/news028_2.html, pp. 1-5, with machine translation.
Koffyberg, F. P., "Optical Bandgaps and Electron Affinities of Semiconducting $Rh_2O_3(I)$ and $Rh_2O_3(III)$", J. Phys. Chem. Solids, vol. 53, No. 10, pp. 1285-1288, 1992.
Hosono, Hideo, "Functional Development of Oxide Semiconductor" Physics Research, Electronic version, vol. 3, No. 1, 031211 (Combined in one volume of Sep. 2013 and Feb. 2014), pp. 1-15, with machine translation.
D. Shinohara et al., "Heteroepitaxy of Corundum-Structured $\alpha$-$Ga_2O_3$ Thin Films on $\alpha$-$Al_2O_3$ Substrates by Ultrasonic Mist Chemical Vapor Deposition", Japanese Journal of Applied Physics, vol. 47., No. 9, pp. 7311-7313, Published online: Sep. 12, 2008.
M. Oda et al., "Schottky barrier diodes of corundum-structured gallium oxide showing on-resistance of 0.1 $m\Omega \cdot cm^2$ grown by Mist Epitaxy®", Applied Physics Express 9, 021101, pp. 021101-1-021101-3, Published online: Jan. 22, 2016.
Robert Schewski et al., "Epitaxial stabilization of pseudomorphic $\alpha$-$Ga_2O_3$ on sapphire (0001)", Applied Physics Express 8, 011101, Dec. 2014, pp. 011101-1-011101-4.
Abidur Rahaman et al., "Effect of Doping Fluorine in Offset Region on Performance of Coplanar a-IGZO TFTs", IEEE Electron Device Letters, Jul. 2018, pp. 1318-1321.
Abidur Rahaman et al., "A High Performance Operational Amplifier Using Coplanar Dual Gate a-IGZO TFTs", IEEE Journal of the Electron Devices Society, vol. 7, Jun. 2019, pp. 655-661.
You Seung Rim et al., "Boost Up Mobility of Solution-Processed Metal Oxide Thin-Film Transistors via Confining Structure on Electron Pathways", Advanced Materials, Jul. 2014, pp. 4273-4278.
Taiwanese Office Action issued Feb. 9, 2023 in corresponding Taiwanese Patent Application No. 108124530, with English translation.
S. I. Stepanov et al., "Gallium Oxide: Properties and Applications—A Review", Rev. Adv. Mater. Sci., vol. 44, (2016), pp. 63-86.
Office Action issued Sep. 19, 2022 in corresponding Indian Patent Application No. 202147000588, with English translation.
M. Higashiwaki et al., "Current status of $Ga_2O_3$ power devices", Jpn. J. Appl. Phys. 55, 1202A1, pp. 1-7 (2016).
Sam-Dong Lee et al., "Thermal stability of single crystalline alpha gallium oxide films on sapphire substrates", Phys. Status Solidi C 10, No. 11, pp. 1592-1595 (2013).
Office Action issued Mar. 8, 2024 in corresponding Taiwanese Application No. 108124530, with English translation.
Office Action issued Jun. 20, 2024 in corresponding Taiwanese Patent Application No. 108124530, with English-language Translation.

* cited by examiner

SEMICONDUCTOR DEVICE AND SEMICONDUCTOR SYSTEM INCLUDING SEMICONDUCTOR DEVICE

TECHNICAL FIELD

The present inventive subject matter relates to a semiconductor device, which is useful as a power device, for example, and also relates to a semiconductor system including the semiconductor device.

BACKGROUND ART

As a switching device of the next generation achieving high withstand voltage, low losses, and high temperature resistance, semiconductor devices using gallium oxide ($Ga_2O_3$) with a large band gap attract attention and are expected to be applied to power semiconductor devices including an inverter. Also, gallium oxide is expected to be applied to light emitting and receiving elements such as a light emitting diode (LED) and a sensor, since gallium oxide has a wide band gap. According to NPL 1, such gallium oxide has a band gap that may be controlled by forming mixed crystal with indium or aluminum singly or in combination and such a mixed crystal is extremely attractive materials as InAlGaO-based semiconductors. Here, InAlGaO-based semiconductors refer to $In_XAl_YGa_ZO_3$ ($0 \leq X \leq 2$, $0 \leq Y \leq 2$, $0 \leq Z \leq 2$, $X+Y+Z=1.5$ to $2.5$) and can be viewed as the same material system containing gallium oxide.

In recent years, gallium oxide-based p-type semiconductors have been studied. For example, PTL 1 describes a substrate showing p-type conductivity to be obtained by forming a $\beta$-$Ga_2O_3$ crystal by floating zone method using MgO (p-type dopant source). Also, PTL 2 discloses to form a p-type semiconductor by using an ion implantation of p-type dopant into $\alpha$-$(Al_XGa_{1-X})_2O_3$ single crystalline film obtained by Molecular Beam Epitaxy (MBE) method. However, NPL2 discloses that a p-type semiconductor was not obtained by the methods disclosed in PTLs 1 and 2 (NPL2). In fact, there has been no reports of any success in forming a p-type semiconductor by use of the methods disclosed in PTLs 1 and 2. Therefore, gallium oxide-based p-type oxide semiconductor and a method of manufacturing a p-type oxide semiconductor have been desired to be realized.

Also, NPLs 3 and 4 disclose that for example, a use of $Rh_2O_3$ or $ZnRh_2O_4$ as a p-type semiconductor has been considered. Nevertheless, $Rh_2O_3$ has a problem with a raw material that tends to be low in concentration especially in film forming process, and a low concentration of the raw material affects forming films. In addition, it has been difficult to produce a single crystal of $Rh_2O_3$ even if using an organic solvent. Also, even though Hall effect measurement was conducted, $Rh_2O_3$ and $ZnRh_2O_4$ were not determined to be p-type or the measurement itself might not be well done. Further, for example, Hall coefficient of these semiconductors were measurement limit (0.2 cm$^3$/C) or less that was not useful at all. Also, since $ZnRh_2O_4$ has a low mobility and a narrow band gap, $ZnRh_2O_4$ cannot be used for LED or power devices. Therefore, $Rh_2O_3$ and $ZnRh_2O_4$ were not necessarily satisfactory.

As a wide band gap semiconductor besides $Rh_2O_3$ and $ZnRh_2O_4$, various p-type oxide semiconductors have been investigated. PTL3 discloses that delafossite or oxychalcogenide are used as p-type semiconductors. However, the semiconductor using delafossite or oxychalcogenide has a mobility of as low as 1 cm$^2$/Vs or less and insufficient electrical properties and thus, the semiconductor using delafossite or oxychalcogenide could not form a p-n junction properly with a next generation n-type oxide semiconductor such as $\alpha$-$Ga_2O_3$.

Also, $Ir_2O_3$ has been conventionally known, for example, to be used as an iridium catalyst as disclosed in PTL 4, and that PTL 5 discloses that $Ir_2O_3$ is used as a dielectric, and PTL 6 discloses that $Ir_2O_3$ is used as an electrode. However, $Ir_2O_3$ has never been known to be used as a p-type semiconductor, and recently, by the present applicant et al., the use of $Ir_2O_3$ as a p-type semiconductor has started to be studied and described in (Patent Document 7). Therefore, research and development of the p-type semiconductor has been progressing, and using enhanced semiconductor materials including gallium oxide ($Ga_2O_3$), semiconductor devices that are able to realize high withstand voltage, low losses, and high temperature resistance have been waiting for.

CITATION LIST

Patent Literature

PTL 1: JP2005-340308A
PTL 2: JP2013-58637A
PTL 3: JP2016-25256A
PTL 4: JPH09-25255A
PTL 5: JPH08-227793A
PTL 6: JPH11-21687A
PTL 7: PCT international publication No. WO2018/043503A

Non Patent Literature

NPL 1: Kaneko, Kentaro, "Fabrication and physical properties of corundum structured alloys based on gallium oxide", Dissertation, Kyoto Univ., March 2013
NPL 2: Tatsuya, Takemoto, EE Times, Japan "power device gallium oxide" Thermal conductivity, p-type overcoming issues and putting it into practical use. [online], Retrieved Jun. 21, 2016, from http://eetimes.jp/ee/articles/1402/27/news028_2.html
NPL 3: F. P. KOFFYBERG et al., "OPTICAL BANDGAPS AND ELECTRON AFFINITIES OF SEMICONDUCTING $Rh_2O_3$(I) and $Rh_2O_3$(III)", J. Phys. Chem. Solids Vol. 53, No. 10, pp. 1285-1288, 1992
NPL 4: Hideo Hosono, "Functional development of oxide semiconductor" Physics Research, Electronic version, Vol. 3, No. 1, 031211 (Combined in one volume of September 2013 and February 2014)

SUMMARY OF INVENTION

Technical Problem

An object of the present inventive subject matter is to provide a semiconductor device that is enhanced in a semiconductor property.

Solution to Problem

The present inventors made careful investigations to achieve the object above, and as the result, the inventors found as a first aspect of the present inventive subject matter that it is possible to obtain a semiconductor device with a threshold voltage that is 3 V or more by arranging an oxide semiconductor film that contains a crystal containing gallium oxide and arranging an oxide film that contains at least phosphorus on the oxide semiconductor film. Also, as a second aspect of the present inventive subject matter, it is found that a semiconductor device with a threshold voltage that is 3 V or more is obtainable by arranging an oxide semiconductor film that contains a crystal having a corundum structure and containing gallium oxide and arranging an oxide film that contains at least phosphorus on the oxide semiconductor film. Furthermore, as a third aspect of the present inventive subject matter, it is found that a semiconductor device that is a normally-off semiconductor device containing as a major component gallium oxide or a mixed crystal of gallium oxide has a threshold voltage that is 3 V or more. The inventors conducted further investigations and succeeded in operational verification of a transistor of gallium oxide semiconductor for the first time in the world, and conducted further investigations to complete the present inventive subject matter.

[1] A semiconductor device includes an oxide semiconductor film having a corundum structure or containing as a major component gallium oxide or a mixed crystal of gallium oxide, and the semiconductor device is a normally-off semiconductor device with a threshold voltage that is 3V or more.

[2] The semiconductor device according to [1], wherein the oxide semiconductor film contains as the major component $\alpha$-$Ga_2O_3$ or the mixed of $\alpha$-$Ga_2O_3$.

[3] The semiconductor device according to [1] or [2], wherein the semiconductor device is a MOSFET, and the threshold voltage is a gate threshold voltage.

[4] The semiconductor device according to [3] further includes an inversion channel region in the oxide semiconductor film; a gate electrode arranged with a gate insulation film that is on the inversion channel region, and; a hydrogen-diffusion prevention film that is an oxide film containing at least one element of elements of Group 15 in the periodic table and being positioned between the inversion channel region and the gate insulation film.

[5] The semiconductor device according to [4], wherein the at least one element is phosphorus.

[6] The semiconductor device according to [4] or [5], wherein the inversion channel region is a p-type semiconductor layer.

[7] The semiconductor device according to any of [1] to [6], wherein the threshold voltage is 7 V or more.

[8] The semiconductor device according to any of [1] to [7], wherein the semiconductor device is a power device.

[9] A semiconductor system includes the semiconductor device according to any of [1] to [8].

[10] A semiconductor device includes an oxide semiconductor film that contains a crystal having a corundum structure and containing gallium oxide, and the semiconductor device is with a threshold voltage that is 3V or more.

[11] A semiconductor device includes an oxide semiconductor film containing a crystal that contains gallium oxide, the semiconductor device being with a threshold voltage that is 3V or more.

[12] The semiconductor device according to [10] or [11], wherein the crystal is a mixed crystal.

[13] The semiconductor device according to [10] or [11], wherein the semiconductor device is a normally-off semiconductor device.

[14] The semiconductor device according to [10] or [11] further includes an inversion channel region in the oxide semiconductor film; a gate electrode arranged with a gate insulation film that is on the inversion channel region, and; a hydrogen diffusion prevention film that is an oxide film, containing at least one element of elements of Group 15 in the periodic table and being positioned between the gate insulation film and the inversion channel region.

[15] The semiconductor device according to claim 14, wherein the element is phosphorus.

Advantageous Effect of the Invention

A semiconductor device according to the present inventive subject matter is enhanced in a semiconductor property such as high withstand voltage, low losses, or high temperature resistance.

DESCRIPTION OF EMBODIMENTS

Figure 1:
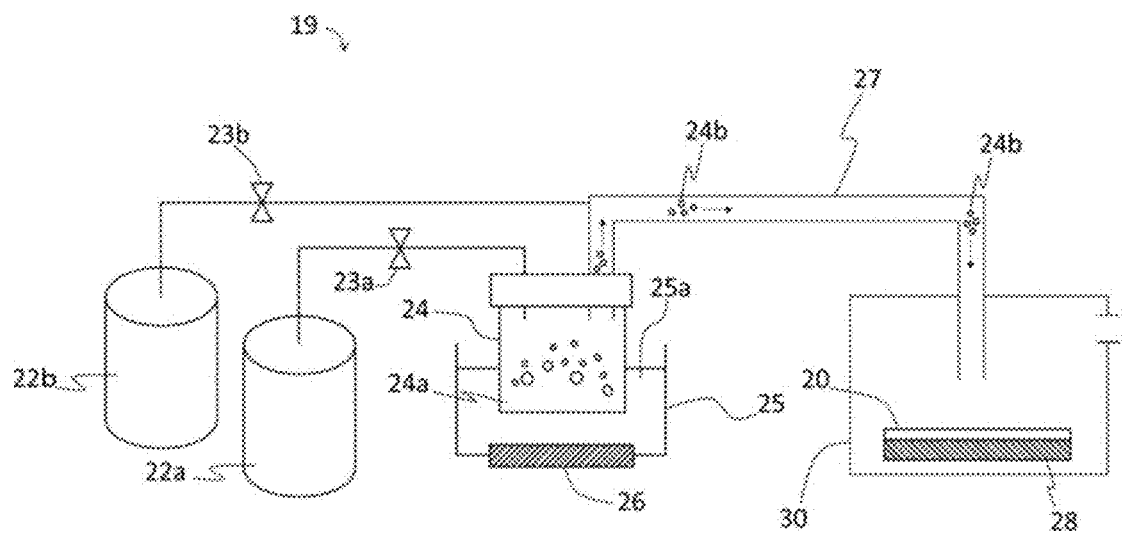
FIG. 1 shows a schematic configuration diagram of a film (layer)-formation apparatus (a mist CVD apparatus) used in an Example of the present inventive subject matter.

A semiconductor device of the present inventive subject matter includes an oxide semiconductor film having a corundum structure or containing as a major component gallium oxide or a mixed crystal of gallium oxide, and the semiconductor device is a normally-off semiconductor device with a threshold voltage that is 3V or more. According to the present inventive subject matter, the semiconductor device is preferably a MOSFET. Also, the threshold voltage may be mentioned as a gate threshold voltage. In the present inventive subject matter, the threshold voltage is obtained from IV characteristics of the semiconductor device, from a practical point of view.

The oxide semiconductor film is not particularly limited as long as the oxide semiconductor film has a corundum structure or contains as a major component gallium oxide or a mixed crystal of gallium oxide, however, in the present inventive subject matter, the oxide semiconductor film preferably contains as a major component $\alpha$-$Ga_2O_3$ or a mixed crystal of $\alpha$-$Ga_2O_3$.

Hereinafter, as a preferred example of the present invention, the present inventive subject matter will be described in more details by referring to a semiconductor device having at least an inversion channel region of an oxide semiconductor film containing gallium oxide or a mixed crystal of gallium oxide as a major component, however, the present inventive subject matter is not limited to these examples.

In the present inventive subject matter, it is possible to obtain a semiconductor device with a threshold voltage that is 3 V or more, and preferably 7 V or more, by arranging an oxide film on an oxide semiconductor film (herein, the "oxide semiconductor film" may be called as an "oxide semiconductor layer") that are configured as a layered structure in the semiconductor device.

The oxide film is a hydrogen-diffusion prevention film to prevent hydrogen diffusion, and is preferably an oxide film containing at least one element of elements of Group 15 in the periodic table. In the present inventive subject matter, the oxide film further preferably contains at least one element of elements of Group 15 in the periodic table and at least one metal or two or more metals of the Group 13 in the periodic table. Examples of the at least one element include nitrogen, phosphorus, antimony, and bismuth, and among them, nitrogen and phosphorus are preferable, and phosphorus is further preferable. Examples of the at least one metal include aluminum (Al), gallium (Ga), and indium (In), and among them, preferably Ga and/or Al, and further preferably Ga. Also, the oxide film is preferably a thin film, that is further preferably 100 nm or less in thickness, and most preferably 50 nm or less in thickness. To form the oxide film, a known method may be used, for example, and a dry method or a wet method may be mentioned, and a surface treatment by phosphoric acid on the inversion channel region is preferable, and a surface treatment by phosphoric acid on gallium oxide or on a mixed crystal of gallium oxide is further preferable. Accordingly, by forming an oxide film containing at least one element of elements of Group 15 in the periodic table, it is possible to obtain a passive film in good quality.

By arranging an oxide film containing at least one element of elements of Group 15 in the periodic table on the inversion channel region, it is possible to prevent the diffusion of hydrogen into oxide semiconductor film, and further possible to lower the interface state, and thus, it is possible to give better semiconductor properties to wide bandgap semiconductors of semiconductor devices. Also, by arranging such an oxide film on the inversion channel region, it is possible to more effectively suppress the gate leakage current, and it is possible to make semiconductor properties more enhanced.

The inversion channel region is preferably of an oxide semiconductor film containing as a major component gallium oxide or a mixed crystal of gallium oxide, and also preferably of an oxide semiconductor film having a corundum structure. The oxide semiconductor film may be a p-type semiconductor film or an n-type semiconductor film. Examples of gallium oxide include a-$Ga_2O_3$, $\beta$-$Ga_2O_3$, and $\varepsilon$-$Ga_2O_3$, and among them, $\alpha$-$Ga_2O_3$ is preferable. Also, the mixed crystal of gallium oxide is a mixed crystal containing gallium oxide and one or two or more metal oxide(s), and preferable examples of the metal oxide include aluminum oxide, indium oxide, iridium oxide, rhodium oxide, and iron oxide.

Also, an oxide semiconductor film having a corundum structure usually contains as a major component a metal oxide, and as the metal oxide, for example, aluminum oxide, indium oxide, iridium oxide, rhodium oxide, and iron oxide are named.

The term "major component" herein means that if an oxide semiconductor film contains $\alpha$-$Ga_2O_3$ as a major component for example, the atomic ratio of gallium to entire metal components in the oxide semiconductor film is 0.5 or more. In the present inventive subject matter, the atomic ratio of gallium to entire metal components in the oxide semiconductor film is preferably 0.7 or more, and further preferably 0.8 or more. Also, even in a case that the crystal of an oxide semiconductor film is a mixed crystal, the oxide semiconductor film preferably contains gallium oxide as a major component. For example, in a case that an oxide semiconductor film contains $\alpha$-$(AlGa)_2O_3$ as a major component for example, the atomic ratio of gallium to entire metal components in the oxide semiconductor film is 0.5 or more. In the present inventive subject matter, the atomic ratio of gallium to entire metal components in the oxide semiconductor film is preferably 0.7 or more, and further preferably 0.8 or more.

Also, the inversion channel region is usually a region of a single layer, however, a second semiconductor region of a different semiconductor layer and/or other layers may be arranged as long as an object of the present inventive subject matter is not interfered with. Also, the semiconductor region is usually in a shape of film, and may be a semiconductor film.

For example, if the oxide semiconductor film is a p-type semiconductor film, the inversion channel region is inverted to be n-type. Also, the oxide semiconductor usually has a shape of film, and also may be a semiconductor layer. The thickness of the oxide semiconductor film is not particularly limited, and the oxide semiconductor film may be 1 μm or less in thickness, and may be 1 μm or more in thickness, however, in the present inventive subject matter, the oxide semiconductor film is preferably 1 μm or more, and further preferably in a range of 1 μm to 40 μm, and most preferably in a range of 1 μm to 25 μm. The surface area of the oxide semiconductor film is not particularly limited, and may be 1 mm$^2$ or more, or 1 mm$^2$ or less. Also, the oxide semiconductor film is usually a single crystal, however, may be a polycrystal. Furthermore, the oxide semiconductor film may be a single-layer film, or may be a multilayer film.

The oxide semiconductor film preferably contains a dopant. The dopant is not particularly limited and may be a known dopant. The dopant may be an n-type dopant and examples of the n-type dopant include tin (Sn), germanium (Ge), silicon (Si), titanium (Ti), zirconium (Zr), vanadium (V), and niobium (Nb). Also, the dopant may be a p-type dopant and examples of the p-type dopant include magnesium (Mg), zinc (Zn), and calcium (Ca). In the present inventive subject matter, the dopant is preferably Sn, Ge, or Si. The contained amount of dopant in the oxide semiconductor film is preferably 0.00001 atomic percent (at. %) or more, and is more preferably in a range of 0.00001 at. % to 20 at. %, and most preferably in a range of 0.00001 at. % to 10 at. %.

In the present inventive subject matter, the inversion channel region is preferably at least a part of a p-type semiconductor layer and a channel region that is inverted to be n-type when a voltage is applied to the semiconductor device, and the p-type semiconductor layer is preferably an oxide semiconductor film containing as a major component gallium oxide or a mixed crystal of gallium oxide. The oxide semiconductor film is preferably a p-type semiconductor film and further preferably contains a p-type dopant. The p-type dopant is not particularly limited, and may be a known p-type dopant as long as the p-type dopant gives electrical conductivity to the oxide semiconductor film as a p-type semiconductor film. Examples of the p type dopant include magnesium (Mg), hydrogen (H), lithium (Li), sodium (Na), potassium (K), rubidium (Rb), cesium (Cs), francium (Fr), beryllium (Be), calcium (Ca), strontium (Sr), barium (Ba), radium (Ra), manganese (Mn), iron (Fe), cobalt (Co), nickel (Ni), palladium (Pd), copper (Cu), silver (Ag), gold (Au), zinc (Zn), cadmium (Cd), mercury (Hg), thallium (Tl), lead (Pb), nitrogen (N), phosphorus (P), and two or more of these elements, however, in the present inventive subject matter, the p-type dopant is preferably Mg, Zn, or Ca.

The oxide semiconductor film is obtainable by use of an epitaxial crystal growth method, and the epitaxial crystal growth method is not particularly limited as long as an object of the present inventive subject matter is not interfered with, and a known method may be used. Examples of the epitaxial crystal growth include a chemical vapor deposition (CVD) method, a Metalorganic Chemical Vapor Deposition (MOCVD) method, a Metalorganic Vapor-phase Epitaxy (MOVPE) method, a mist CVD method, a mist epitaxy method, a Molecular Beam Epitaxy (MBE) method, a HVPE method, and a pulse growth method. In the present inventive subject matter, the mist CVD method or the mist epitaxy method is preferably used as the epitaxial crystal growth method.

In the present inventive subject matter, the film-formation preferably includes turning a raw-material solution containing a metal into atomized droplets that are to be floated (forming atomized droplets), carrying the atomized droplets by use of carrier gas onto a base member (carrying the atomized droplets), and causing thermal reaction of the atomized droplets adjacent to the base member to form a film on the base member (forming a film).

(Raw-Material Solution)

The raw-material solution is not particularly limited as long as the raw-material solution contains a metal as a raw material for film formation and is able to be atomized, and the raw material solution may contain an inorganic material and may contain an organic material. The metal may be a simple metal or may be a metal compound, and is not particularly limited as long as an object of the present inventive subject matter is not interfered with. Examples of the metal include gallium (Ga), Iridium (Ir), indium (In), rhodium (Rh), aluminum (Al), gold (Au), silver (Ag), platinum (Pt), copper (Cu), iron (Fe), manganese (Mn), nickel (Ni), palladium (Pd), cobalt (Co), ruthenium (Ru), chromium (Cr), molybdenum (Mo), tungsten (W), tantalum (Ta), zinc (Zn), lead (Pb), rhenium (Re), titanium (Ti), tin (Sn), gallium (Ga), magnesium (Mg), calcium (Ca) and zirconium (Zr), and one or two or more metals may be selected from the examples, however, in the present inventive subject matter, the metal preferably contains one or two or more metal(s) selected from metals of Period 4 to Period 6 of the periodic table, further preferably contains at least gallium, indium, aluminum, rhodium, or iridium, and most preferably contains at least gallium. By use of such preferable metal(s), it is possible to form an epitaxial film suitably used for semiconductor devices.

In the present inventive subject matter, as the raw-material solution, those containing the metal(s) in the form of complex or salt dissolved or dispersed in an organic solvent or water are preferably used. Examples of the form of the complex include acetylacetonato complexes, carbonyl complexes, ammine complexes, and hydrido complexes. Examples of the form of the salt include organic metal salts (e.g., metal acetate, metal oxalate, metal citrate, etc.), metal sulfide salt, metal nitrate salt, metal phosphate salt, metal halide salt (e.g., metal chloride salt, metal bromide salt, metal iodide salt, etc.).

The solvent of the raw-material solution is not particularly limited, as long as an object of the present inventive subject matter is not interfered with. The solvent may be an inorganic solvent, such as water, or may be an organic solvent, such as alcohol, or may be a mixed solvent of the inorganic solvent and the organic solvent. In the present inventive subject matter, the solvent preferably contains water.

To the raw-material solution, an additive, such as hydrohalic acid and an oxidant, may be mixed. Examples of the hydrohalic acid include hydrobromic acid, hydrochloric acid, and hydroiodic acid. Examples of the oxidant include: peroxides, such as hydrogen peroxide ($H_2O_2$), sodium peroxide ($Na_2O_2$), barium peroxide ($BaO_2$), and benzoyl peroxide ($(C_6H_5CO)_2O_2$); hypochlorous acid (HClO); perchloric acid; nitric acid; ozone water; organic peroxides, such as peracetic acid and nitrobenzene. The blending ratio of the additive is not particularly limited, however, is preferably, with respect to the raw material solution, in a range of 0.001 volume % to 50 volume %, and is more preferably, in a range of 0.01 volume % to 30 volume %.

The raw-material solution may contain a dopant. The dopant is not particularly limited as long as an object of the present inventive subject matter is not interfered with. Examples of the dopant include the n-type dopants and the p-type dopants, mentioned above. The dopant concentration, in general, may be approximately in a range of $1\times10^{16}/cm^3$ to $1\times10^{22}/cm^3$, or the dopant concentration may be set at low concentration of, for example, approximately $1\times10^{17}/cm^3$ or less. Also, according to the present inventive subject matter, the dopant may be contained to be at high concentration of approximately $1\times10^{20}/cm^3$ or more.

(Forming Atomized Droplets)

At the forming atomized droplets, a raw material solution containing a metal is adjusted, the raw material solution is atomized, and droplets that are atomized are floated, to generate atomized droplets. The blending ratio of the metal is not particularly limited, but is preferably, with respect to the raw material solution, in a range of 0.0001 mol/L to 20 mol/L. The method of atomization is not particularly limited as long as the raw material solution is able to be atomized, and a known method may by used, however, in the present inventive subject matter, a method of atomization using ultrasonic vibration is preferable. The atomized droplets, used in the present inventive subject matter, floating in the space with the initial velocity that is zero and carriable as a gas, is preferable without being blown like a spray. The size of droplets is not limited to a particular size, and may be a few mm, however, the size of the atomized droplets is preferably 50 μm or less, and further preferably in a range of 1 μm to 10 μm.

(Carrying the Atomized Droplets)

In carrying the atomized droplets, the atomized droplets are carried by carrier gas onto a base member. The carrier gas is not particularly limited as long as an object of the present inventive subject matter is not interfered with. Preferable examples of the carrier gas include oxygen, ozone, and an inert gas (e.g., nitrogen, argon, etc.), and a reducing gas (e.g., hydrogen gas, forming gas, etc.). One or more carrier gas of the examples may be used, and a dilution gas with a variation of concentration (e.g., 10-fold dilution gas) may be used as a second carrier gas. Also, the carrier gas may be supplied from one or two or more locations. While the flow rate of the carrier gas is not particularly limited, however, the flow rate of the carrier gas may be preferably regulated to be 1 L/min or less, and further preferably in a range of 0.1 L/min. to 1 L/min.

(Forming a Film)

In forming a film, the atomized droplets are reacted to form a film on the base member. The reaction is not particularly limited as long as a film is formed from the atomized droplets by the reaction, however, according to the present inventive subject matter, a thermal reaction is preferable. The thermal reaction may function as long as the atomized droplets react by heat, and reaction conditions are not particularly limited as long as an object of the present inventive subject matter is not interfered with. Here, the thermal reaction is usually carried out at an evaporation temperature of the solvent or higher temperatures, however, the temperature range for the thermal reaction is not too high, and preferably carried out at a temperature 650° C. or less. Also, the thermal reaction may be carried out in any atmosphere and not particularly limited as long as an object of the present inventive subject matter is not interfered with. The thermal reaction may be carried out under a vacuum, a non-oxygen atmosphere, a reducing-gas atmosphere, and an oxygen atmosphere, and also under any conditions of atmospheric pressure, increased pressure, and reduced pressure, however, in the present inventive subject matter, the thermal reaction is preferably carried out under an atmospheric pressure, because calculation of evaporation temperature is simpler and also apparatus and equipment are able to be simplified. The thickness of the film is able to be set by adjusting a film-formation time.

(Base Member)

The base member is not particularly limited as long as the base member is able to support the semiconductor film to be formed on the base member. The material for the base member is not particularly limited as long as an object of the present inventive subject matter is not interfered with, and the base member may be a known base member and may be of an organic compound, and may be of an inorganic compound. Examples of the shape of the base member include a plate shape, such as a flat plate and a disk, a fibrous shape, a rod shape, a cylindrical shape, a prismatic shape, a tubular shape, a spiral shape, a spherical shape, and a ring shape, and in the present inventive subject matter, a substrate is preferable. The thickness of the substrate is not particularly limited in the present inventive subject matter.

The substrate is in a plate shape and is not particularly limited as long as the substrate becomes a support for the semiconductor film. The substrate may be an insulating substrate, a semiconductor substrate, a metal substrate, or an electrically-conductive substrate, however, the substrate is preferably an insulating substrate, and also the substrate is preferably a substrate including a metal film on a surface of the substrate. Examples of the substrate include a base substrate containing a substrate material with a corundum structure as a major component, a base substrate containing a substrate material with a β-gallia structure as a major component, and a base substrate containing a substrate material with a hexagonal structure as a major component, and the like. The "major component" herein means that a substrate material with a specific crystal structure mentioned above, with respect to the entire components of the substrate, is contained in the substrate to account for preferably 50% or more, more preferably 70% or more, and even more preferably 90% or more, and possibly 100% at an atomic ratio.

The substrate material is not particularly limited as long as an object of the present inventive subject matter is not interfered with, and may be a known substrate material. Preferable examples of the substrate material with the corundum structure include α-$Al_2O_3$ (sapphire substrate) and α-$Ga_2O_3$ substrate, and further preferable examples include an a-plane sapphire substrate, an m-plane sapphire substrate, an r-plane sapphire substrate, a c-plane sapphire substrate, and α-gallium oxide substrates (e.g., an a-plane, m-plane, or r-plane). Also, examples of the substrate material with a β-gallia structure as a major component include β-$Ga_2O_3$ substrate, and a substrate of mixed crystal containing $Ga_2O_3$ and $Al_2O_3$ in a condition that $Al_2O_3$ is more than 0 wt % and 60 wt % or less. Examples of the base substrate containing a substrate material with a hexagonal structure as a major component include a SiC substrate, a ZnO substrate, and a GaN substrate.

In the present inventive subject matter, after a film is formed, annealing may be carried out. The annealing temperature is not particularly limited as long as an object of the present inventive subject matter is not interfered with, and is generally carried out at a temperature in a range of 300° C. to 650° C. and preferably in a range of 350° C. to 550° C. The annealing time is generally in a range of 1 minute to 48 hours, preferably in a range of 10 minutes to 24 hours, and more preferably in a range of 30 minutes to 12 hours. The annealing may be carried out in any atmosphere as long as an object of the present inventive subject matter is not interfered with, and preferably in a non-oxygen atmosphere and more preferably in a nitrogen atmosphere.

Also, in the present inventive subject matter, the semiconductor film may be formed directly on the base member or may be provided on another layer, such as a buffer layer and a stress relief layer, arranged on the base member. The method of forming each of layers is not particularly limited, and may be a known method, however, in the present inventive subject matter, a mist CVD method or a mist epitaxy method is preferable.

With reference to the figure, a film (layer)-formation apparatus 19 suitably used for a method such as the mist CVD method or the mist epitaxy method is explained. The film (layer)-formation apparatus 19 includes a carrier gas supply device 22a, a flow-control valve 23a to control a flow rate of carrier gas sent from the carrier gas supply device 22a, a carrier gas (dilution) supply device 22b, a flow-control valve 23b to control a flow rate of carrier gas (dilution) sent from the carrier gas (dilution) supply device 22b, a mist generator 24 in that a raw material solution 24a is contained, a vessel 25 in that water 25a is contained, an ultrasonic transducer 26 attached to a bottom of the vessel 25, a film (layer)-formation chamber 30, and a supply tube 27 of quartz connecting the mist generator 24 and the film (layer)-formation chamber 30, and a hot plate (heater) 28 placed in the film (layer)-formation chamber 30. A substrate 20 is placed on the hot plate 28.

As shown in FIG. 1, the raw-material solution 24a is stored in the mist generator 24, and a substrate 20 is placed on the hot plate 28, and the hot plate is activated to increase the temperature in the film (layer)-formation chamber 30. Next, the flow control valves 23 (23a and 23b) are opened to supply carrier gas from the carrier gas supply devices 22 (22a and 22b) into the film (layer)-formation chamber 30. After the atmosphere in the film (layer) formation chamber 30 is sufficiently replaced with the carrier gas, the flow rate of the carrier gas and the flow rate of carrier gas (dilution) are respectively adjusted. The ultrasonic transducer 26 is activated to vibrate and the vibrations propagate through the water 25a to the raw material solution 24a, thereby atomizing the raw material solution 24a to produce the atomized droplets 24b. The atomized droplets 24b are introduced into the film (layer)-formation chamber 30 by carrier gas and carried onto the substrate 20, and under atmospheric pressure, the atomized droplets 24b are thermally reacted in the film (layer)-formation chamber 30 to form a film on the substrate 20.

In the present inventive subject matter, the film obtained at the forming a film may be used in the semiconductor device as it is, also, the film after using a known method to be separated from the substrate may be applied to the semiconductor device.

Also, the oxide semiconductor film that is a p-type semiconductor film preferably used in the present inventive subject matter, for example, is obtainable by a p-type dopant and hydrobromic acid that are added to the raw material solution containing a metal, by the mist CVD method. Here, it is essential to add hydrobromic acid as an additive to the raw material solution. Furthermore, each procedure of the mist CVD method and conditions in each procedure and condition may be the same as those in the above-mentioned procedures such as Forming atomized droplets, Carrying the atomized droplets, and Forming a film. The p-type semiconductor film thus obtained is also good in pn junction with n-type semiconductor, and is suitably used for the inversion channel region.

The inversion channel region is typically provided between semiconductor regions with electrical conductivity that is different. For example, in a case that the inversion channel region is provided in the p-type semiconductor layer, the inversion channel region is typically provided between the semiconductor regions of n-type semiconductor. Also, in a case that the inversion channel region is provided in the n-type semiconductor layer, the inversion channel region is typically provided between the semiconductor regions of p-type semiconductor. Also, the method of forming each semiconductor region may be the same as the method described above.

Also, in the present inventive subject matter, an oxide film containing at least an element selected from elements of the Group 15 in the periodic table is preferably arranged on the inversion channel region. As the element, examples of the element include nitrogen (N) and phosphorus (P), and according to the present inventive subject matter, nitrogen (N) or phosphorus (P) is preferable, and phosphorus (P) is more preferable. For example, an oxide film containing at least phosphorus, positioned between the gate insulation film and the inversion channel region, and arranged on the inversion channel region, prevents hydrogen from diffusing into the oxide semiconductor film, and since it is also possible to lower interface state, a semiconductor device, especially a semiconductor device with a wide band gap semiconductor, is able to obtain an enhanced semiconductor characteristic, and the semiconductor device that is a normally-off semiconductor device with a threshold voltage that is 3 V or more is able to be realized. In the present inventive subject matter, the oxide film further preferably contains at least one of the elements of the Group 15 in the periodic table and one or two or more metals of the Group 13 of the periodic table. Examples of the metal include aluminum (Al), gallium (Ga), and indium (In), and particularly, Ga and/or Al is preferable, and Ga is further preferable. Also, the oxide film is preferably a thin film to be 100 nm or less in thickness, and most preferably a film that is 50 nm or less in thickness. The arrangement of such an oxide film makes it possible to further effectively suppress the gate leakage current and to obtain further enhanced semiconductor characteristics. As a method of forming the oxide film, for example, a known method may be used, and more specifically, examples of the method include a dry method and a wet method, however, surface treatment by phosphoric acid, for example, on the inversion channel region is preferable.

Further, according to the present inventive subject matter, a gate electrode is, if necessary, arranged with a gate insulation film that is on and/or above the inversion channel region and the oxide film. The gate insulation film is not particularly limited as long as an object of the present inventive subject matter is not interfered with, and may be a known insulation film. As the gate insulation film, preferable examples include films of $SiO_2$, $Si_3N_4$, $Al_2O_3$, GaO, AlGaO, InAlGaO, AlInZnGaO$_4$, AlN, $Hf_2O_3$, SiN, SiON, MgO, and GdO, and an oxide film (e.g., an oxide film containing at least phosphorus). The method of forming the gate insulation film may be a known method, and examples of the known method include a dry method and a wet method. Examples of the dry method include known methods such as sputtering, vacuum deposition, CVD (Chemical Vapor Deposition), and PLD (Pulsed Laser Deposition). Examples of the wet method include a method of application such as screen printing or die coating.

The gate electrode may be a known gate electrode, and material(s) of the electrode may be an electrically-conductive inorganic material, and also may be an electrically-conductive organic material. In the present inventive subject matter, the material(s) of the electrode is preferably a metal, and the metal is not particularly limited, however, at least one metal selected from metals of Group 4 to Group 11 in the periodic table may be named. Examples of the metal of the Group 4 in the periodic table include titanium (Ti), zirconium (Zr), and hafnium (Hf), and particularly, Ti is preferable. Examples of the metal of Group 5 in the periodic table include vanadium (V), niobium (Nb), and tantalum (Ta). Examples of the metal of Group 6 in the periodic table include chromium (Cr), molybdenum (Mo), and tungsten (W), and one or two or more metals may be selected from, however, in the present inventive subject matter, Cr is more preferable because semiconductor properties including a switching characteristic become better. Examples of the metal of Group 7 in the periodic table include manganese (Mn), technetium (Tc), and Rhenium (Re). Examples of the metal of Group 8 in the periodic table include iron (Fe), ruthenium (Ru), and osmium (Os). Examples of the metal of Group 9 in the periodic table include cobalt (Co), rhodium (Rh), and iridium (Ir). Also, examples of the metal of Group 10 in the periodic table include nickel (Ni), palladium (Pd), and platinum (Pt), and particularly, Pt is preferable. Examples of the metal of Group 11 in the periodic table include copper (Cu), silver (Ag), and gold (Au). The method of forming the gate electrode may be, for example, a known method, and more specifically, examples of the method include a dry method and a wet method. As the dry method, for example, sputtering, vacuum deposition, or CVD may be mentioned as a known method. As the wet method, for example, screen printing or die coating may be mentioned.

In the present inventive subject matter, not only the gate electrode, but usually a source electrode and a gate electrode are provided, and similarly to the gate electrode, the source electrode and the gate electrode may be known electrodes, respectively, and may be formed by use of known methods, respectively.

The semiconductor device is particularly useful for power devices. As the semiconductor device, for example, a transistor may be named, and the semiconductor device is particularly suitable for a MOSFET.

(MOSFET)

Figure 2:
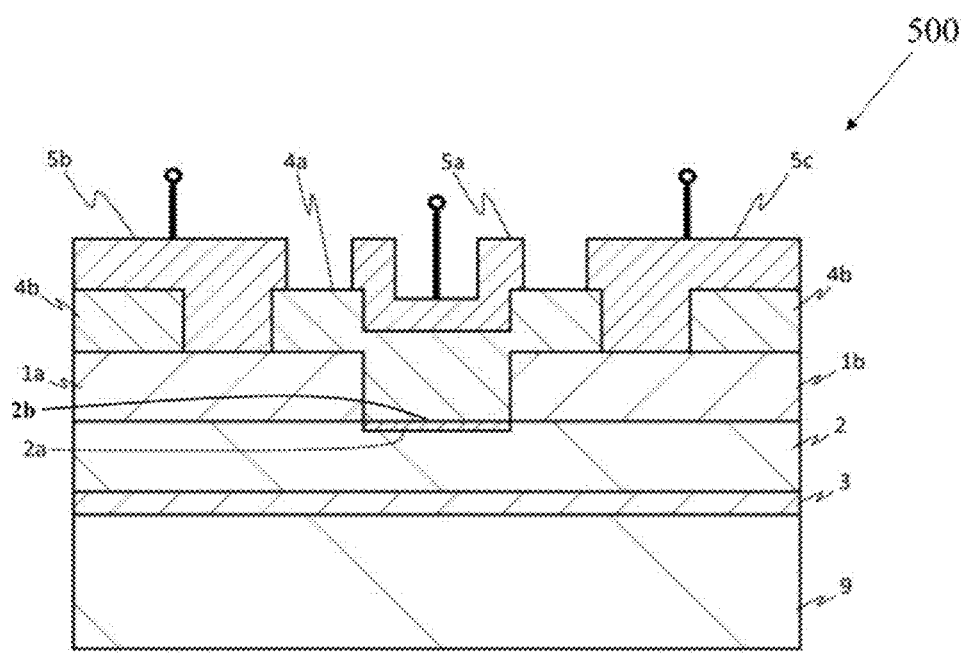
FIG. 2 shows a schematic view of an aspect of a MOSFET, as an example of a semiconductor device in the present inventive subject matter.

FIG. 2 shows a preferable example in a case that a semiconductor device in the present inventive subject matter is a MOSFET. The semiconductor device 500 in FIG. 2 is a planar MOSFET, and includes an n⁺-type semiconductor layer (n⁺-type source layer) as a first semiconductor region 1a, an n⁺-type semiconductor layer (n⁺-type drain layer) as a second semiconductor region 1b, a p-type semiconductor layer as an oxide semiconductor film 2, that includes an inversion channel region 2a on that an oxide film 2b containing phosphorus is formed, a metal oxide film 3, an insulation layer 4a (a gate insulation layer), an insulation layer 4b (a field insulation layer), a gate electrode as a third electrode 5a, a source electrode as a first electrode 5b, a drain electrode as a second electrode 5c, and a substrate 9. The metal oxide film 3 contains gallium oxide. The metal oxide film 3 may contain as a major component gallium oxide. Also, the metal oxide film 3 preferably has resistance higher than resistance of the oxide semiconductor film 2, and preferably is a layer without containing a dopant.

In the state of "on" of the MOSFET shown in FIG. 2, by applying a voltage between the source electrode 5b and the drain electrode 5c, when a positive voltage with respect to the source electrode 5b is applied to the gate electrode 5a, an n-type inversion channel region is formed at the inversion channel region 2a of the oxide semiconductor film 2, and thus, that results in a turn-on. Also, regarding the state of "off", by setting the voltage of the gate electrode to zero, the inversion channel layer is not formed and thus, that results in a turn-off.

Figure 9:
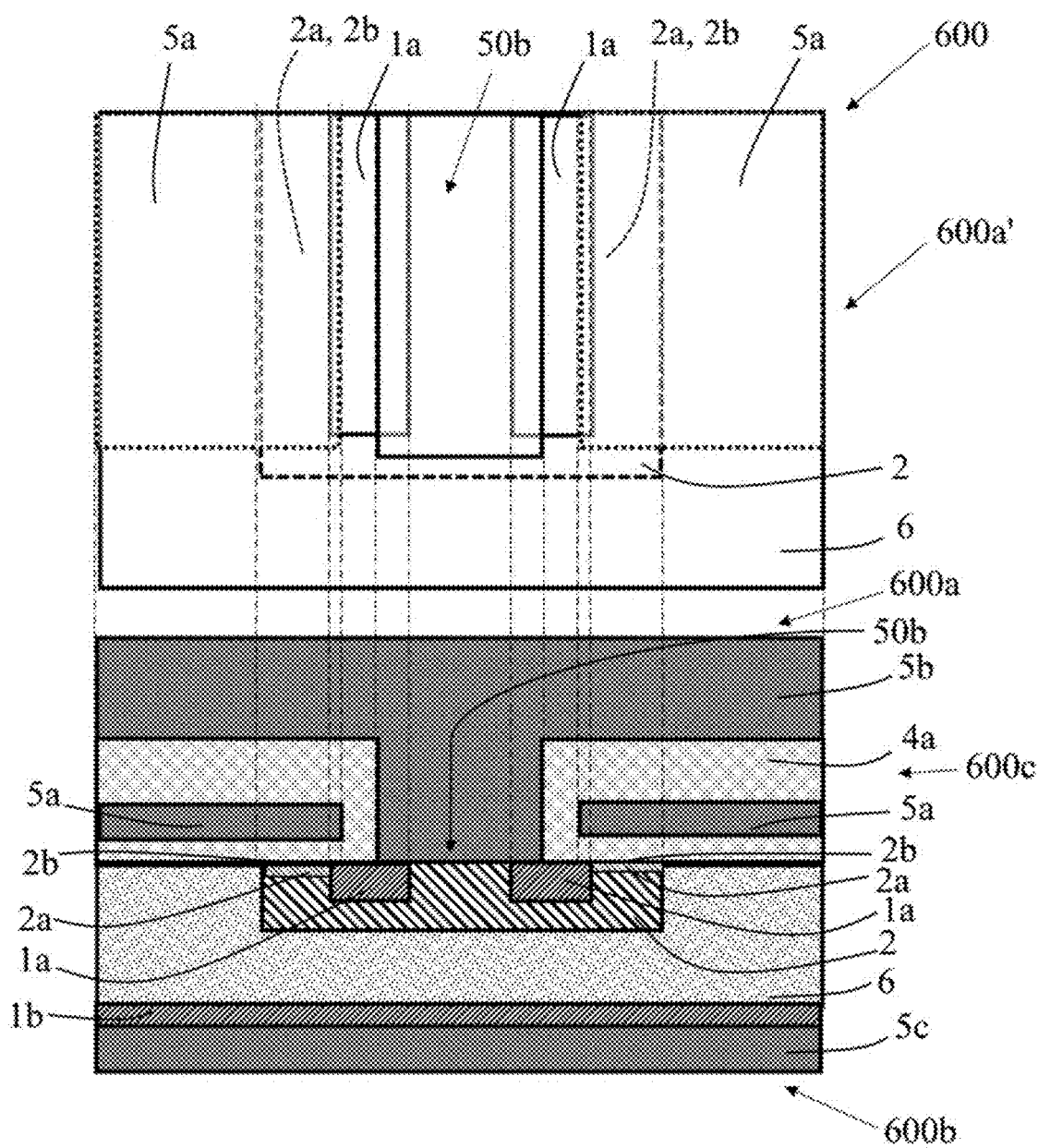
FIG. 9 shows a partial perspective view (600a') of a vertical semiconductor device as an example of a semiconductor device according to the present inventive subject matter, viewed from the side of a first surface of the semiconductor device in a condition that a source electrode and a portion of an insulation layer under the source electrode are removed, and a partial cross-sectional view (600c) of the semiconductor device including the source electrode and the insulation layer under the source electrode at the side of the first surface of the semiconductor device.

FIG. 9 shows a partial perspective view (600a') of a vertical semiconductor device as an example of a semiconductor device according to the present inventive subject matter, viewed from the side of a first surface 600a of the vertical semiconductor device in a condition that a first electrode 5b and a portion of an insulation layer 4a under the first electrode 5b are removed, and a partial cross-sectional view (600c) of the semiconductor device 600. For easier understanding, the second semiconductor region 1b and the second electrode 5c that are positioned at a side of a second surface 600b are not shown in the partial perspective view 600a' viewed from the side of the first surface 600a but shown in the partial cross-sectional view 600c that also shows the first electrode 5b, the insulation layer 4a. The semiconductor device 600 of this embodiment shows a vertical device structure in that electrodes are arranged on the side of the first surface 600a and the side of the second surface 600b of semiconductor device 600. The semiconductor device 600 includes an oxide semiconductor film 2 that contains a crystal containing at least gallium oxide, and the oxide semiconductor film 2 includes an inversion channel region 2a and an oxide film 2b that is positioned in contact with the inversion channel region 2a. Furthermore, the semiconductor device 600 includes a first electrode 5b that is arranged on the side of the first surface of the oxide semiconductor film 2, a second electrode 5c that is arranged on the side of the second surface of the oxide semiconductor film 2, and a third electrode 5a that is at least partially positioned between the first electrode 5b and the second electrode 5c in cross-sectional view. Also, as shown in 600c of FIG. 11, the third electrode 5a is spaced away from the first electrode 5b by the insulation layer 4a, and is also spaced away from the second electrode 5c by two or more layers as shown in the figure. The semiconductor device in this embodiment is able to be used as a vertical MOSFET. For example, in a case that the oxide semiconductor film 2 is a p-type semiconductor film and includes an inversion channel region 2a on that an oxide film 2b containing phosphorus is arranged, the first electrode 5b is a source electrode, the second electrode 5c is a drain electrode, and the third electrode 5a is a gate electrode. Furthermore, the semiconductor device 600 includes a first semiconductor region 1a positioned in the oxide semiconductor film 2, at least a portion of the oxide semiconductor film 2 is embedded in the third semiconductor region 6, the second semiconductor region 1b that is arranged in contact with the second surface of the third semiconductor region 6, the second electrode 5c that is arranged in contact with the second semiconductor region 1b. Also, 50b shows a contact surface of the first electrode, that is partially in contact with the oxide semiconductor film 2 and the first semiconductor region 1a that is positioned in the oxide semiconductor film 2. The second electrode 5c is positioned on the side of the second surface 600b of the semiconductor device 600. In this embodiment, the first semiconductor region 1a is an n⁺-type semiconductor layer (n⁺-type source layer). Further, the second semiconductor region 1b is an n⁺-type semiconductor layer (n⁺-type drain layer). In this embodiment, the oxide semiconductor film 2 is a p-type semiconductor film, and includes an oxide film 2b that is in contact with the inversion channel region 2a and that contains phosphorus and is arranged at a position close to the third electrode 5a (gate electrode). This structure enables to suppress gate leakage current more efficiently. If the gate leakage current is suppressed, a problem in that gate leakage current interferes with a formation of an inversion channel region is solved and the semiconductor device 600 with enhanced semiconductor properties is obtainable. Also, as in the sixth embodiment, by arranging the first electrode (a source electrode) on the side of the first surface 600a of the semiconductor device and the second electrode (a drain electrode) on the side of the second surface 600b so that the semiconductor device is vertical, and the semiconductor device is able to be downsized, compared to a planar semiconductor device with one side (the side of the first surface 600a or the side of the second surface 600b) on that the first electrode (a source electrode) and the second electrode (a drain electrode) are arranged. In addition, if such a vertical semiconductor device is arranged together with other vertical device(s), circuit design is facilitated because the devices are same vertical devices.

A semiconductor device according to the present inventive subject matter is, provided with the mentioned above, able to be suitably useful as a power module, inverter, or converter, using further known methods, and is also suitably used in, for example, semiconductor systems using a power device. The power device can be obtained from the semiconductor device or obtained as a semiconductor device by connecting the semiconductor device to wiring patterns by using a known method, for example. FIG. 12 shows a power system 170 including two or more power devices 171, 172, and a control circuit 173. The power system 170, as shown in FIG. 13, may be combined with an electric circuit 181 and a power system 182 for a system device 180. FIG. 14 shows a schematic view of a power source circuit of a power source device. FIG. 14 illustrates a power supply circuit of a power device, including a power circuit and a control circuit. A DC voltage is switched at high frequencies by an inverter 192 (configured with MOSFET A to D) to be converted to AC, followed by insulation and transformation by a transformer 193. The voltage is then rectified by rectification MOSFET (A~B') and then smoothed by a DCL 195 (smoothing coils L1 and L2) and a capacitor to output a direct current voltage. At this point, the output voltage is compared with a reference voltage by a voltage comparator 197 to control the inverter and the rectification MOSFET 194 by a PWM control circuit 196 to have a desired output voltage.

Example 1

Figure 3:
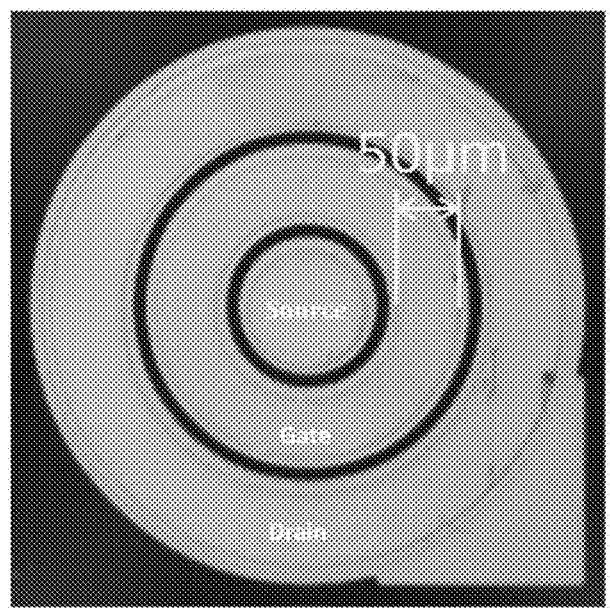
FIG. 3 shows a picture of a MOSFET that was made in an Example, shown from above.
Figure 4:
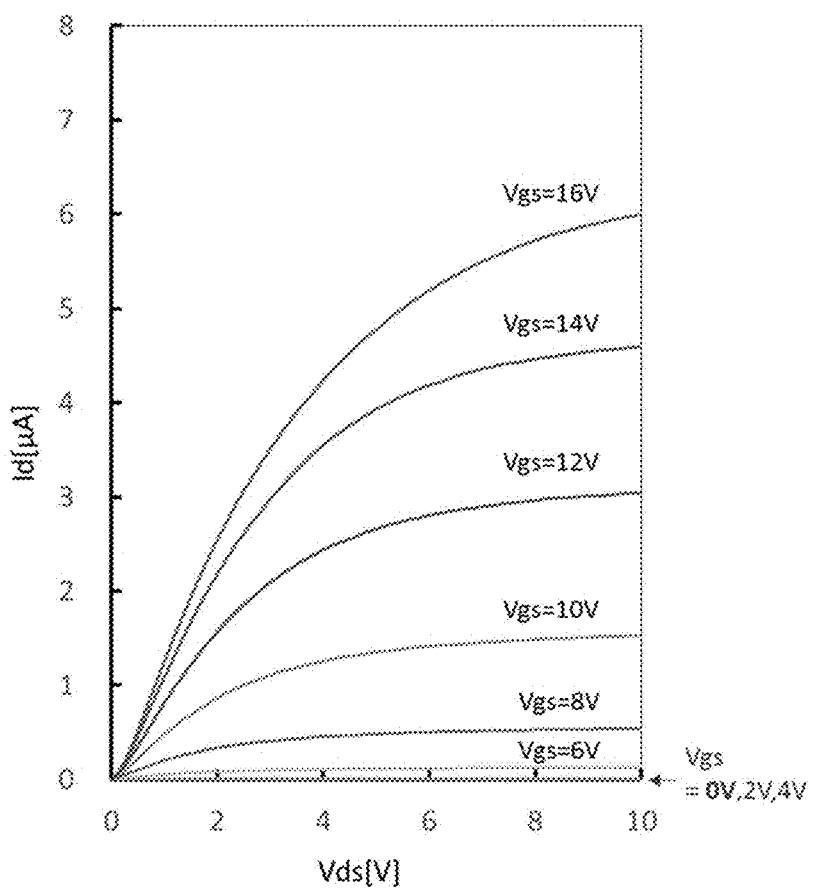
FIG. 4 shows a result of current-voltage (IV) measurement of the semiconductor device in the Example.
Figure 5:
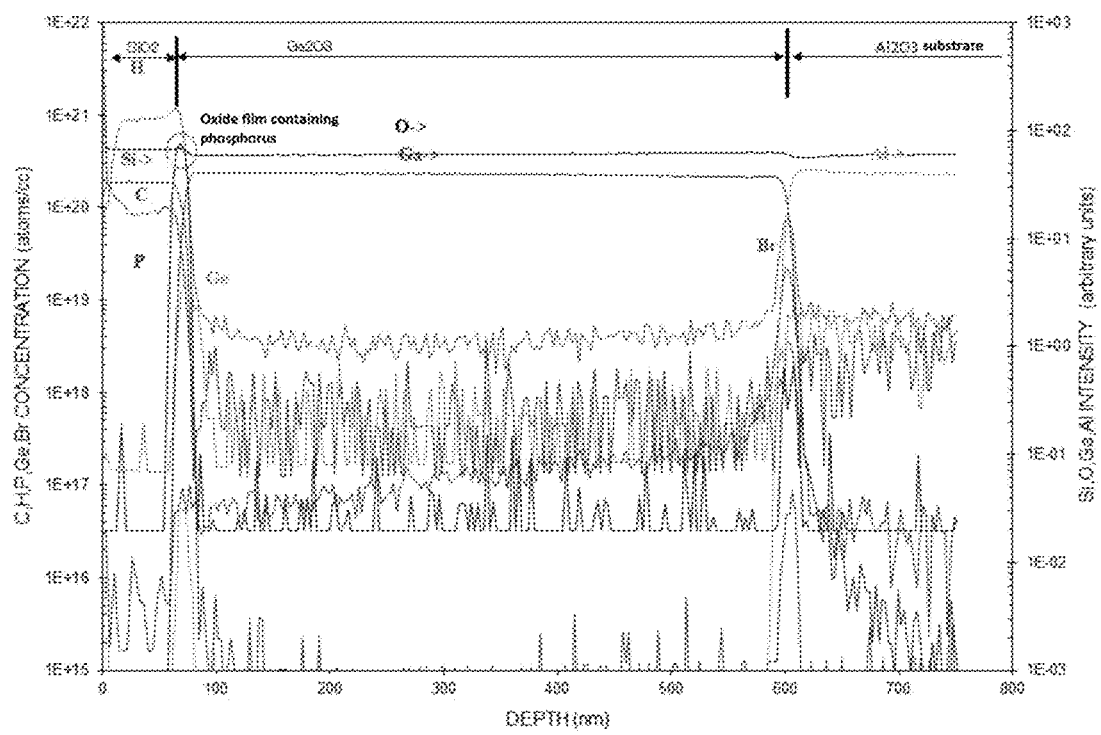
FIG. 5 shows a secondary-ion mass spectrometry (SIMS) measurement result of the semiconductor device in the Example.
Figure 6:
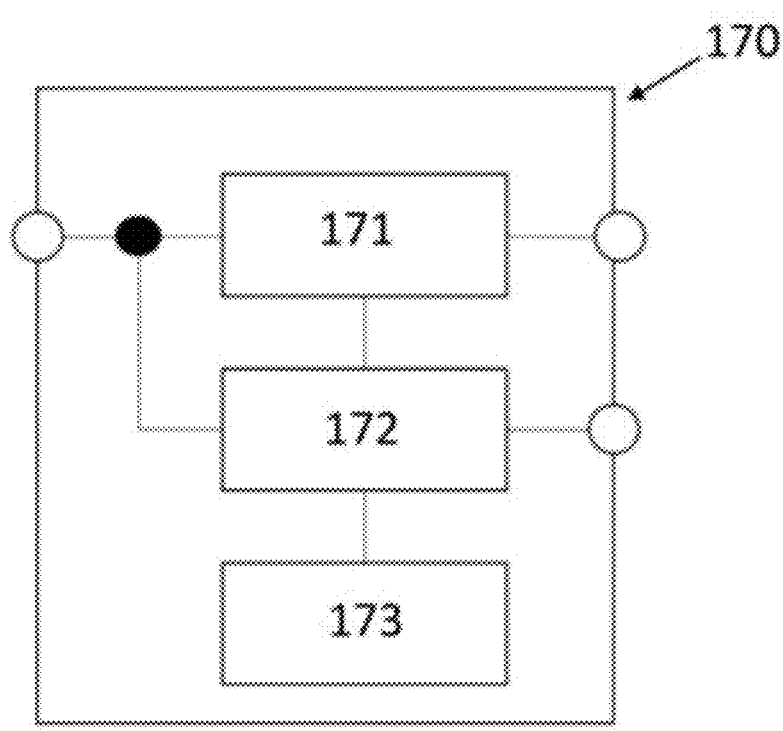
FIG. 6 shows a schematic view of a power system as an example.
Figure 7:
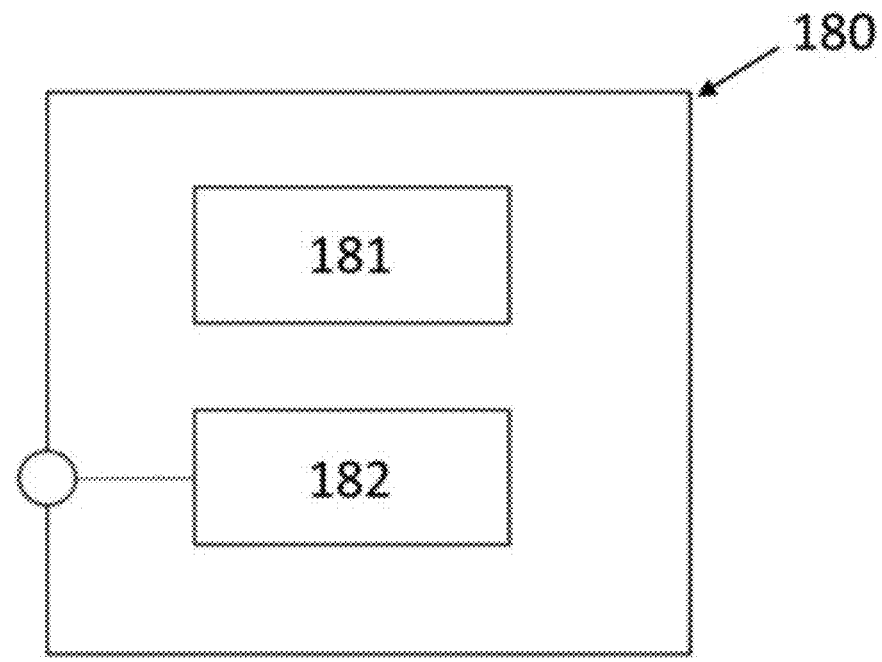
FIG. 7 shows a schematic view of a system device as an example.
Figure 8:
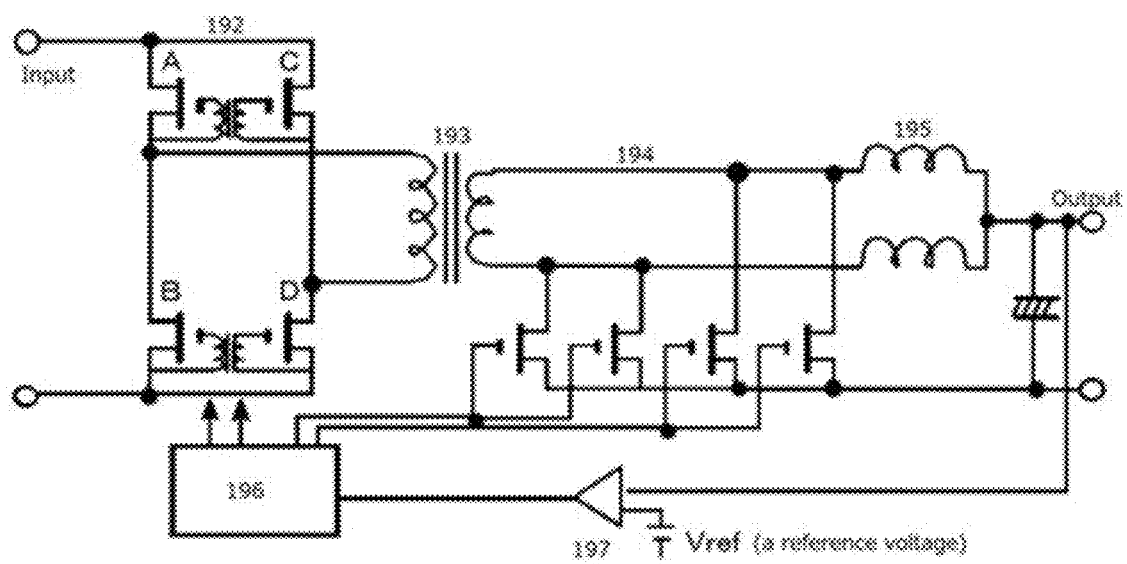
FIG. 8 shows a schematic view of a power source circuit of power source device as an example.

A MOSFET shown in FIG. 2 was made.
1. Forming a p-Type Semiconductor Layer
1-1. Film (Layer)-Formation Apparatus
The film (layer)-formation apparatus 19 shown in FIG. 1 was used.
1-2. Preparing a Raw-Material Solution
A raw-material solution was prepared by hydrobromic acid that is contained to be 20% by volume ratio in an aqueous solution of 0.1M gallium bromide, and also Mg that is added in the aqueous solution to be 1 volume %.
1-3. Film (Layer)-Formation Preparation
The raw-material solution 24a obtained at 1-2. above was set in a container of the mist generator 24. Then, a sapphire substrate with a surface on that a non-doped α-$Ga_2O_3$ film is formed was placed as a substrate 20 on a susceptor 21, and the heater 28 was activated to raise the temperature in the film-formation chamber 30 up to 520° C. Next, the flow-control valves 23a, 23b were opened to supply carrier gas from the carrier gas supply device 22a and the carrier gas (dilution) supply device 22b, which are the source of carrier gas, into the film-formation chamber 30 to replace the atmosphere in the film-formation chamber 30 with the carrier gas sufficiently, and then, the flow rate of the carrier gas was regulated at 1 L/min. and the carrier gas (dilution) was regulated at 1 L/min. In this embodiment, nitrogen was used as the carrier gas.
1-4. Formation of a Semiconductor Film
The ultrasonic transducer 26 was then activated to vibrate at 2.4 MHz, and vibrations were propagated through the water 25a to the raw material solution 24a to turn the raw material solution 24a into atomized droplets. The atomized droplets were introduced in the film (layer)-formation chamber 30 by the carrier gas, and reacted under atmospheric pressure at 520° C. to be formed into a semiconductor film on the substrate 20. The film thickness was 0.6 μm and the film-formation time was 15 minutes.
1-5. Evaluation
The film obtained at the above 1-4. was evaluated by use of the X-ray diffraction (XRD) analysis device, and the film was found to be a film of α-$Ga_2O_3$.
2. Forming an $n^+$-Type Semiconductor Region
An $n^+$-type semiconductor film was formed on the p-type semiconductor layer that was obtained at the above 1. by the same conditions as the conditions of the forming the p-type semiconductor layer obtained at the above 1. except the following conditions: a raw-material solution was prepared by hydrobromic acid that is contained to be 10% by volume ratio in an aqueous solution of 0.1M gallium bromide and also tin bromide that is contained to be 8% by volume ratio in the aqueous solution; the film-formation temperature was set to 580° C., and the film-formation time was set to five minutes. The film that was obtained was evaluated by use of the X-ray diffraction (XRD) analysis device, and the film was found to be a film of α-$Ga_2O_3$.
3. Forming an Insulation Film and Each Electrode
The $n^+$-type semiconductor layer was etched with phosphoric acid at a region corresponding to the gate portion (between 1a and 1b), and furthermore, after treatment with phosphoric acid so that an oxide film containing at least phosphorus is formed on the semiconductor film, and then, a film of $SiO_2$ was formed by sputtering. Also, through treatment of photolithography, etching, and electron-beam evaporation, a MOSFET as shown in FIG. 2 was obtained. For each electrode, Ti was used. FIG. 3 shows a picture of a MOSFET, taken from above for reference.
(Evaluation)
IV measurement was carried out on the MOSFET that was obtained. FIG. 4 shows the result of IV measurement. As is apparent from FIG. 4, an inversion-channel region was formed, and it was demonstrated for the first time in the world that the MOSFET of gallium oxide semiconductor functions as a transistor. Then, the gate threshold voltage obtained from the IV characteristics was 7. 9V. Also, at the above 3., SIMS measurement was performed to confirm whether an oxide film containing at least phosphorus is formed between the p-type semiconductor layer and the gate insulation film (that is the film of $SiO_2$). FIG. 5 shows the result of SIMS measurement. Based on FIG. 5, it can be seen that an oxide film containing phosphorus is formed between the p-type semiconductor layer and the gate insulation film, and furthermore, that it can be seen that the oxide film containing phosphorus prevents hydrogen in the gate insulation film from diffusing into the p-type semiconductor layer effectively.

INDUSTRIAL APPLICABILITY

A semiconductor device according to the present inventive subject matter is applicable to a wide variety of fields, such as semiconductors (e.g., compound semiconductor electronic devices, etc.), electronic and electrical components, optical and electronic photograph related devices, and industrial parts, and particularly useful for power devices.

REFERENCE NUMBER DESCRIPTION 1a a first semiconductor region
1b a second semiconductor region
2 an oxide semiconductor film
2a an inversion channel region
2b an oxide film
2c a second surface of the oxide semiconductor film
3 a metal oxide film
4a an insulation layer
4b an insulation layer
5a a third electrode
5b a first electrode
5c a second electrode
6 a third semiconductor region
9 a substrate
19 a film (layer)-formation apparatus
20 a substrate
21 a susceptor
22a a carrier gas supply device
22b a carrier gas (dilution) supply device
23a a flow control valve of carrier gas
23b a flow control valve of carrier gas
24 a mist generator
24a a raw material solution
25 a vessel
25a water
26 an ultrasonic transducer
27 a supply tube
28 a heater
29 an exhaust port
50b a contact surface of the first electrode
100 a semiconductor device
170 a power system 171 a power device
172 a power device
173 a control circuit
180 a system device
181 an electric circuit
182 a power system
192 an inverter
193 a transformer
194 MOSFET
195 a DCL
196 a PWM control circuit
197 a voltage comparator
500 a semiconductor device
600 a semiconductor device

What is claimed is:

1. A semiconductor device comprising:
an oxide semiconductor film that is crystalline, the oxide semiconductor film having a corundum structure, the oxide semiconductor film consisting of gallium oxide;
a source electrode positioned on a side of a first surface of the oxide semiconductor film; and
a gate electrode positioned on the side of the first surface of the oxide semiconductor film,
wherein the semiconductor device is a normally-off semiconductor device with a threshold voltage that is 3 V or more.

2. The semiconductor device according to claim 1, wherein the oxide semiconductor film consists of $\alpha$-$Ga_2O_3$.

3. The semiconductor device according to claim 1, wherein the semiconductor device is a MOSFET, and the threshold voltage is a gate threshold voltage.

4. The semiconductor device according to claim 3, further comprising:
an inversion channel region in the oxide semiconductor film;
a gate insulation film that is on the inversion channel region, the gate electrode being arranged with the gate insulation film; and
a hydrogen-diffusion prevention film that is an oxide film comprising at least one element of elements of Group 15 in the periodic table and being positioned between the gate insulation film and the inversion channel region.

5. The semiconductor device according to claim 4, wherein the at least one element is phosphorus.

6. The semiconductor device according to claim 5, wherein the threshold voltage is 7 V or more.

7. The semiconductor device according to claim 4, wherein the inversion channel region is a p-type semiconductor layer.

8. The semiconductor device according to claim 4, wherein
oxide semiconductor film is a p-type semiconductor layer, the inversion channel region is provided in the oxide semiconductor film between semiconductor regions that are n-type semiconductor regions.

9. The semiconductor device according to claim 1, further comprising:
an inversion channel region in the oxide semiconductor film;
a gate insulation film that is on the inversion channel region, the gate electrode being arranged with the gate insulation film; and
a hydrogen-diffusion prevention film that is an oxide film comprising at least one element of elements of Group 15 in the periodic table and being positioned between the gate insulation film and the inversion channel region.

10. The semiconductor device according to claim 1, wherein the semiconductor device is a power device.

11. A semiconductor system comprising:
the semiconductor device according to claim 1.

12. The semiconductor device according to claim 1, further comprising:
a drain electrode positioned on the side of the first surface of the oxide semiconductor film.

13. The semiconductor device according to claim 1, further comprising:
a drain electrode positioned on a side of a second surface of the oxide semiconductor film.

14. A semiconductor device comprising:
an oxide semiconductor film that is crystalline and consists of gallium oxide;
a source electrode positioned on a side of a first surface of the oxide semiconductor film; and
a gate electrode positioned on the side of the first surface of the oxide semiconductor film,
wherein the semiconductor device is a normally-off semiconductor device with a threshold voltage that is 3 V or more.

15. The semiconductor device according to claim 14, further comprising:
an inversion channel region in the oxide semiconductor film;
a gate insulation film that is on the inversion channel region, the gate electrode being arranged with the gate insulation film; and
an oxide film that is a hydrogen diffusion prevention layer, comprising at least one element of elements of Group 15 in the periodic table and being positioned between the gate insulation film and the inversion channel region.

16. The semiconductor device according to claim 15, wherein the at least one element is phosphorus.

17. The semiconductor device according to claim 15, wherein
the oxide semiconductor film is a p-type semiconductor layer, the inversion channel region is provided in the oxide semiconductor film between semiconductor regions that are n-type semiconductor regions.

18. A semiconductor device comprising:
an oxide semiconductor film comprising a crystal and consisting of gallium oxide;
a source electrode positioned on a side of a first surface of the oxide semiconductor film;
a gate electrode positioned on the side of the first surface of the oxide semiconductor film; and
a drain electrode positioned on a side of a second surface of the oxide semiconductor film,
wherein the semiconductor device has a threshold voltage that is 3 V or more.

19. The semiconductor device according to claim 18, further comprising:
an inversion channel region in the oxide semiconductor film;
a gate insulation film that is on the inversion channel region, the gate electrode being arranged with the gate insulation film; and
an oxide film that is a hydrogen diffusion prevention layer, comprising at least one element of elements of Group 15 in the periodic table and being positioned between the gate insulation film and the inversion channel region.

20. The semiconductor device according to claim 19, wherein the at least one element is phosphorus.

* * * * *